United States Patent [19]

Tsai

[11] Patent Number: 5,187,447
[45] Date of Patent: Feb. 16, 1993

[54] COMBINER/DIVIDER NETWORKS

[75] Inventor: Ming-Chi Tsai, Marlborough, Mass.

[73] Assignee: Raytheon Company, Lexington, Mass.

[21] Appl. No.: 797,644

[22] Filed: Nov. 25, 1991

[51] Int. Cl.[5] .............................. H03F 3/68; H01P 5/18
[52] U.S. Cl. .................................. 330/124 R; 330/295; 333/116; 333/117
[58] Field of Search .................................. 333/115–117, 333/128, 238; 330/124 R, 149, 295

[56] References Cited

U.S. PATENT DOCUMENTS

| | | | |
|---|---|---|---|
| 3,390,356 | 6/1968 | Ryals et al. | 333/115 |
| 5,025,233 | 6/1991 | Leonakis | 333/128 |
| 5,105,171 | 4/1992 | Wen et al. | 333/116 |

FOREIGN PATENT DOCUMENTS 274401 12/1986 Japan .................................. 333/116

Primary Examiner—Paul Gensler
Attorney, Agent, or Firm—Denis G. Maloney; Richard M. Sharkansky

[57] ABSTRACT

A planar interdigitated microstrip coupler comprises a plurality of adjacently disposed transmission lines being spaced such that the transmission lines gradually diverge from a close spacing to a wider spacing. The planar interdigitated microstrip coupler provides equal power split and either 0° or 180° differential phase shift over a multi-octave bandwidth. Further, the interdigitated coupler, when used as a power combiner, provides increased cancellation of second order intermodulation products normally generated by non-linear devices, such as amplifiers, which may be fed to the inputs of the coupler. This increase in second harmonic cancellation, known for distorting signal fidelity, is particularly useful for monolithic circuit applications using amplifiers and mixers.

12 Claims, 5 Drawing Sheets

COMBINER/DIVIDER NETWORKS

BACKGROUND OF THE INVENTION

This invention relates generally to radio frequency circuits and more particularly to radio frequency interdigitated coupler circuits.

As is known in the art, an ideal hybrid junction circuit is a four-port network in which a signal incident on any one of the ports divides between two output ports with the remaining port being isolated. The assumption is that all output ports are terminated in a perfect match. Under these conditions, the input to any port is perfectly matched.

Hybrid circuits are frequently used as components in radio frequency systems or subsystems, such as balanced mixers, balanced amplifiers, attenuators, measurement bridges, phase shifters, and modulators. Hybrid circuits are generally classified according to the phase shift between the two outputs. Two basic types of hybrid circuits are 180° hybrids and 90° (quadrature) hybrids.

The increasing use of microwave integrated circuits has produced a need for small, low insertion loss networks which can be easily fabricated using a planar propagation media such as microstrip.

One problem encountered by circuit designers, with regard to hybrid couplers, is the design of couplers having relatively tight coupling (i.e., coupling values less than 6 decibels). As is known in the art, tight coupling in directional couplers for microwave integrated circuits may be achieved by using broadside coupling, reentrant sections, tandem sections, or branch-line couplers. However, couplers using broadside coupling o reentrant sections require multilayer circuitry which is generally difficult to fabricate on ceramic microstrip or monolithic substrates. Couplers using tandem sections or branch-line couplers generally have narrower bandwidths and require much larger substrate areas than single-section coupled line arrangements.

One hybrid coupler having broadband performance relative to the aforementioned versions and attractive for use in planar applications is the interdigitated coupler. An interdigitated coupler, often called a "Lange" coupler, has three or more parallel transmission lines with alternate lines tied together. This configuration provides a hybrid circuit eminently suited for thin-film microwave integrated circuits (MIC) or monolithic circuits. However, one problem with interdigitated Lange couplers is that their use is generally limited to bandwidths of approximately one octave.

Wideband multi-octave directional couplers have been developed using a design approach based on the analogy between multisection directional couplers and stepped impedance transformers. Both 90° and 180° couplers developed with this approach typically provide a significant improvement in bandwidth performance. When such couplers are to be provided in a planar media, stripline is generally the propagation media of choice. As is also known, stripline transmission lines include at least one strip conductor dielectrically spaced between a pair of ground plane conductors. When two strip conductors are used, the strip conductors are overlaid and disposed on separate planes and separated by a dielectric. The use of stripline eliminates problems related to the normally thin spacing required for providing tight coupling between adjacent strip conductors of microstrip transmission lines, such as those described above in the interdigitated Lange coupler. For this reason, overlaid stripline transmission lines generally permit tighter coupling over broader ranges of frequency than microstrip.

On the other hand, because stripline is enclosed by ground planes both below and above the strip conductors, it is generally more difficult to make minor adjustments to the circuit or to attach discrete devices to the circuit. Microstrip is more convenient for these applications since the top surface of the circuit is accessible.

Monolithic microwave integrated circuits (MMIC) or glass microwave integrated circuits (GMIC), similarly have both their active devices and passive circuitry disposed on a top surface of a substrate. Accordingly, microstrip is often selected for the development of circuits which are eventually desired to be fabricated in monolithic microwave integrated circuit form.

It is apparent from the above that both microstrip interdigitated Lange couplers and stripline multi-octave couplers possess advantages and disadvantages not inherent in the other. Accordingly, there is a need for a directional coupler having relatively tight coupling and multi-octave bandwidth characteristics which can be fabricated using microstrip transmission media. Such a directional coupler may be adapted to be used in monolithic or glass microwave integrated circuit applications.

SUMMARY OF THE INVENTION

In accordance with the present invention, a radio frequency circuit includes a dielectric substrate having a ground plane over a first surface thereof and a plurality of strip conductors disposed over a second surface of the substrate. The radio frequency circuit further has a first one of said plurality of strip conductors coupled between a first pair of terminals of the circuit, and a succeeding one of the plurality of strip conductors being coupled to a terminal of said circuit and being spaced from the first strip conductor with the spacing between the first strip conductor and the succeeding strip conductor gradually increasing. With such an arrangement, a radio frequency circuit having a plurality of adjacently disposed strip conductor with a gradually increasing spacing between the strip conductors is provided. The gradually increasing spacing provides the strip conductors as microstrip transmission lines having an impedance distribution between and along adjacent lines that is relatively smooth rather than being stepped or discontinuous. The increasing spacing between adjacent lines provides a high pass frequency response characteristic to the circuit rather than a bandpass characteristic generally associated with coupled transmission lines having stepped spacings. These radio frequency circuits having such coupled transmission lines will provide radio frequency operation over relatively broader bandwidths as compared to circuits using step spaced coupled lines.

In accordance with a further aspect of the present invention, a radio frequency coupler includes a dielectric substrate having a ground plane disposed over a first surface thereof and a plurality of strip conductors disposed over a second surface of the dielectric substrate. A first one of the plurality of strip conductors has a first end coupled to a first terminal and a second end coupled to a second terminal of the radio frequency coupler and a second one of the plurality of strip conductors, disposed adjacent to the first strip conductor, having a first end coupled to a third terminal of the radio frequency coupler. The second strip conductor has a first portion having a spacing which is substantially uniform but which preferably monotonically and slowly increases from the first strip conductor, with the first portion thereof being coupled at a first end to the third terminal of the circuit. A second portion of the second strip conductor starting at a second end of the first portion has a spacing which monotonically increases and where the spacing between said second portion and adjacent first strip conductor is substantially more pronounced than the corresponding spacing of the first portion to the adjacent portion of the first strip conductor. A third one of the plurality of strip conductors is disposed adjacent to the first strip conductor on a side thereof opposite the second strip conductors, having a first end coupled to a fourth terminal of the coupler with the third conductor having a first portion at the end thereof spaced a distance from the first strip conductor which gradually decreases starting at the end thereof which is coupled to the fourth terminal to a second portion spaced a substantially uniform distance from the first strip conductor. With such an arrangement, a planar interdigitated microstrip coupler having a plurality of adjacently disposed strip conductors with a gradually increasing spacing between the strip conductors is provided. The strip conductors, in this arrangement provide a conductor circuit having a tightly coupled section where the strip conductors are spaced relatively close to each other and a loosely coupled section where the strip conductors are widely spaced from each other. The gradually increasing spacing between strip conductors provides a plurality of microstrip transmission lines having a relatively smooth impedance distribution between lines rather than a stepped or discontinuous impedance distribution. The relatively smooth impedance distribution between the gradually increasing spaced strip conductors provides an interdigitated coupler which will divide or combine signals over broader ranges of operating frequencies compared to couplers having stepped impedance coupled lines.

In accordance with an additional aspect of the present invention, the coupler further includes a transmission line having a first end coupled to the second terminal of the radio frequency coupler such that a differential phase shift between a second end of the transmission line and the fourth terminal of the coupler is substantially 180°. With such an arrangement, the coupler and transmission line when used as a power combiner provides increased cancellation of second harmonics, second order intermodulation products as well as other even order harmonics and intermodulation products which are typically generated by non-linear devices such as amplifiers. This increase in even order harmonic and intermodulation product cancellation is attractive for monolithic circuit applications requiring hybrids for combining non-linear devices such as amplifiers and mixers.

BRIEF DESCRIPTION OF THE DRAWINGS

The foregoing features of this invention, as well as the invention itself, may be more fully understood by the following detailed description of the drawings, in which.

DESCRIPTION OF THE PREFERRED EMBODIMENTS

Figure 1:
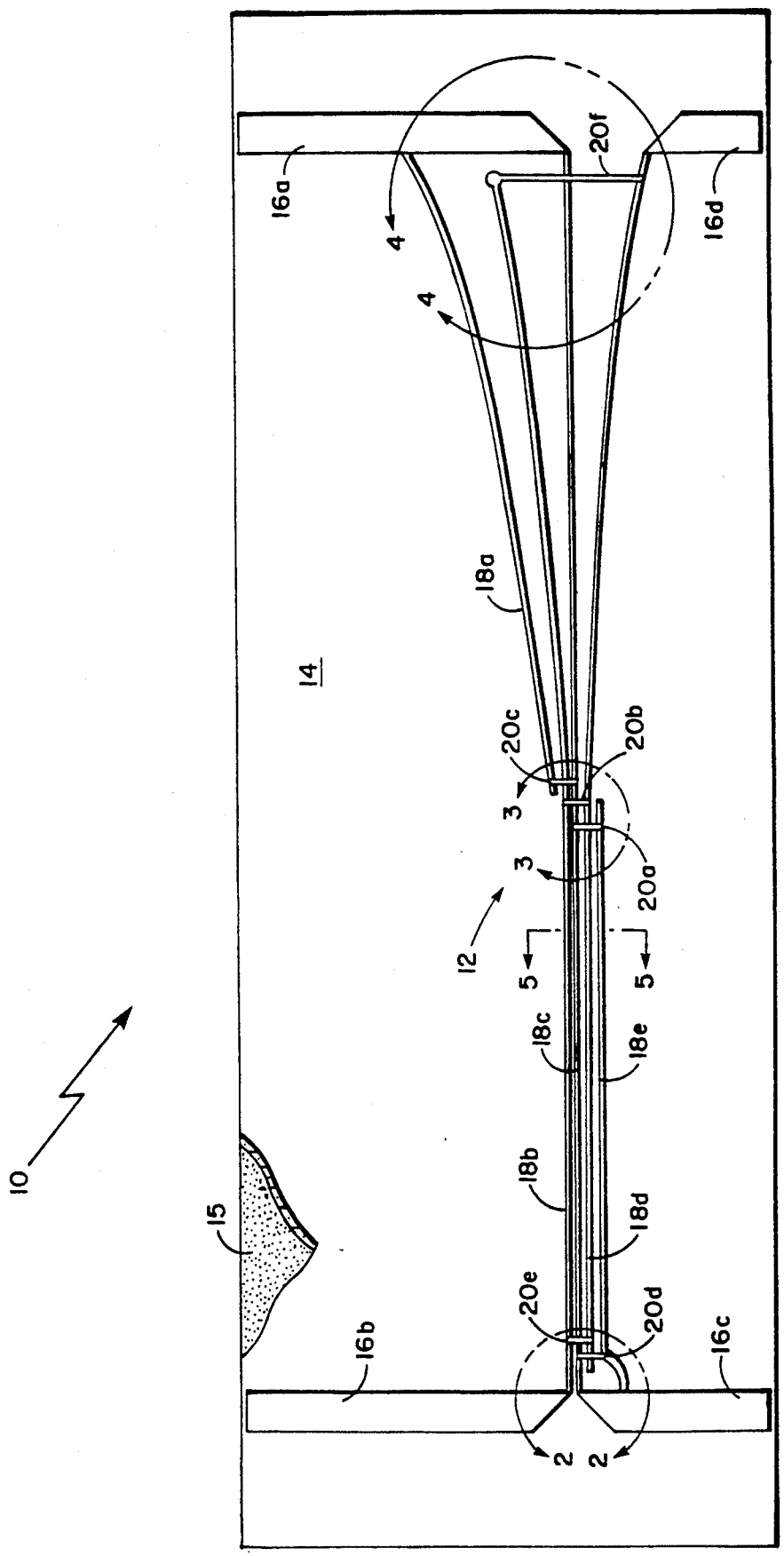
FIG. 1 is a plan view of an interdigital hybrid combiner fabricated as a microwave integrated circuit in accordance with the present invention.
Figure 2:
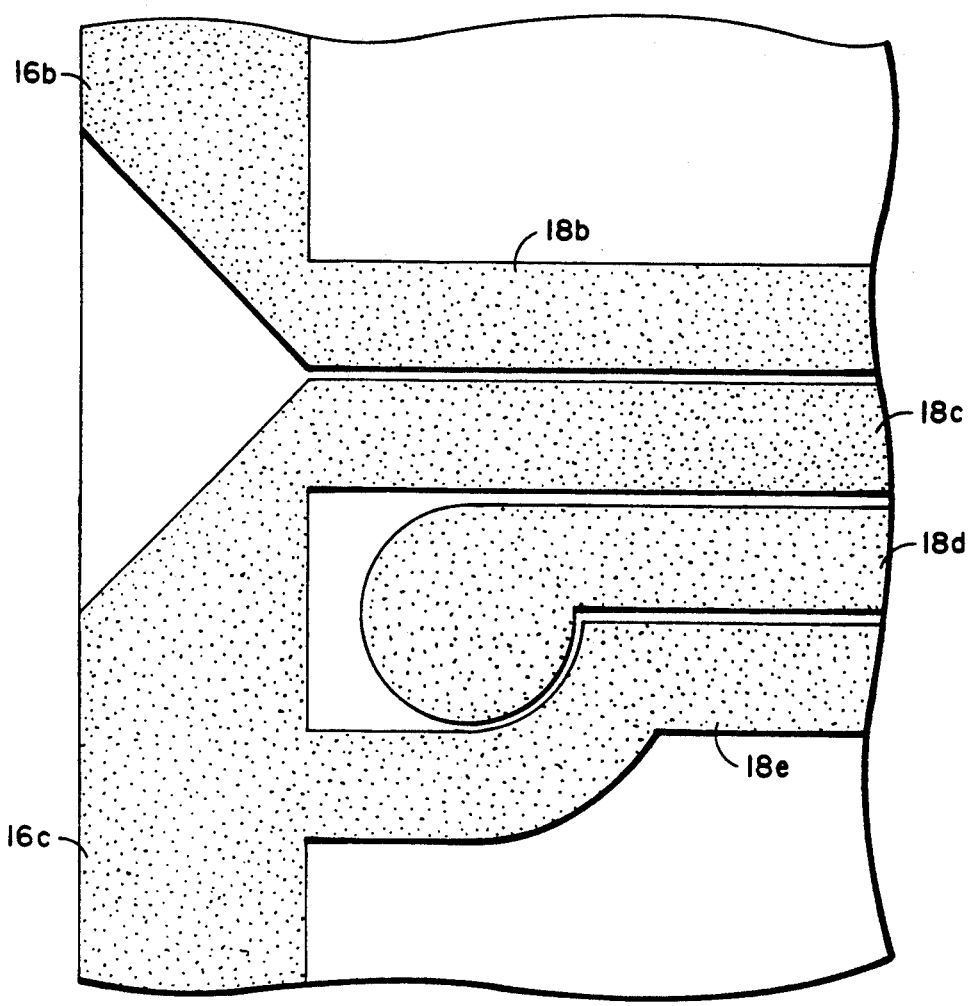
FIG. 2 is an enlarged view of a portion of FIG. 1 taken along lines 2—2 of FIG. 1.
Figure 3:
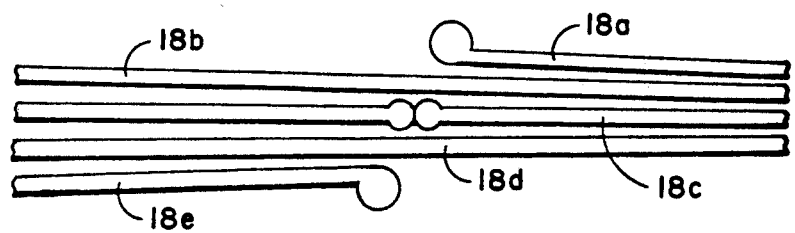
FIG. 3 is an enlarged view of a portion of FIG. 1 taken along lines 3—3 of FIG. 1.

Referring now to FIGS. 1-5, an interdigitated radio frequency circuit here, a hybrid combiner 10 is shown fabricated as a microwave integrated circuit (MIC). The hybrid combiner 10 is shown to include a conductor circuit 12 disposed over a substrate 14, here comprised of alumina or other suitable dielectric material. For example, combiner 10 may be fabricated as a monolithic microwave integrated circuit (MMIC) on materials such as GaAs or other suitable Group III-V materials. Alternatively, combiner 10 may be fabricated as a glass microwave integrated circuit (GMIC) on glass materials. The substrate 14 has disposed on a bottom surface portion thereof, a ground plane conductor 15. The conductor circuit 12 provided from a conductive material, such as gold, is deposited or plated over the substrate 14 using any conventional technique such as electroplating, evaporation or sputtering.

The conductor circuit 12, here includes a plurality of four branch arms 16a–16d, each having first ends coupled or joined to suitable connecting terminals (not shown) of the hybrid combiner. For example, such connecting terminals may be conventional microstrip to coaxial cable connectors. Alternatively, such connecting terminals may be other microstrip circuitry coupled to the hybrid combiner. The branch arms 16a–16d of the hybrid combiner 10 represent input, isolated, direct and coupled ports respectively, of the combiner 10.

Branch arms 16a–16d have second ends selectively coupled to ends of a plurality of strip conductors 18a–18e. In particular, strip conductor 18c has a first end coupled to corresponding branch arm 16c and a second end coupled to branch arm 16a for providing a direct signal path from the input port 16a to the direct port 16c of the hybrid combiner 10. Strip conductors 18a, 18b, 18d and 18e are disposed adjacent to strip conductor 18c and here, have linewidths approximate to the linewidth of 18c. Strip conductors 18a, 18b, and 18d have first ends coupled to corresponding, branch arms 16a, 16b, 16d and second ends terminated in an open circuit. Strip conductor 18e has a first end coupled to branch arm 16c and a second end open circuited. The spacing between strip conductor 18b and strip conductor 18c is relatively narrow along the portion nearest the junction of branch arm 16b but gradually increases to a relatively wide spacing as the line approaches branch arm 16a. Similarly, strip conductor 18d, at its junction with branch arm 16d, has a relatively wide spacing to strip conductor 18c which gradually converges to a close spacing at its open circuited end. Strip conductor 18a has a first end coupled to branch arm 16a and has a relatively wide spacing at the coupling location which gradually decreases to a close spacing to strip conductor 18c at its open circuited end. Strip conductor 18e coupled to branch arm 16c maintains a relatively close spacing to strip conductor 18c along its entire length. Thus, it can be seen that the conductor circuit 12 has a first portion where conductors 18b, 18d, and 18e appear to have substantially uniform spacings from conductor 18c, and have a second portion where said conductors 18b, 18d and 18a have gradually increasing or diverging spacing from conductor 18c. However, the strip conductors within the first portion preferably have a spacing which diverges at a relatively slow degree from a first end to the second portion where the spacing is more pronounced.

The hybrid combiner is shown to further include a plurality of crossovers 20a-20c in the form of wire, ribbon or for MMIC implementations, air bridge conductors overlaid across adjacent strip conductors of the conductor circuit 12. The crossovers 20a-20c are disposed between alternate strip conductors 18a-18e and are contacted to the conductor circuit 12 using a wire, ribbon bonder, or any other technique as would be known by one of ordinary skill in the art. The crossovers 20a-20c are here, disposed at the center coupled section of the conductor circuit 12 in order to provide a symmetric impedance characteristic to the circuit. In some configurations, good performance of the hybrid combiner (i.e., high isolation, high return loss, and exact phase difference) may be dependent on the symmetry of the circuit layout. In addition, multiple crossovers may be used between alternate strip conductors to reduce bonding wire inductance of the crossovers, which generally degrades circuit performance. Additional crossovers 20d, 20e are shown here disposed at the tightly coupled end portion and crossover 20f is shown disposed at the loosely coupled end portion of the conductor circuit 12.

Figure 4:
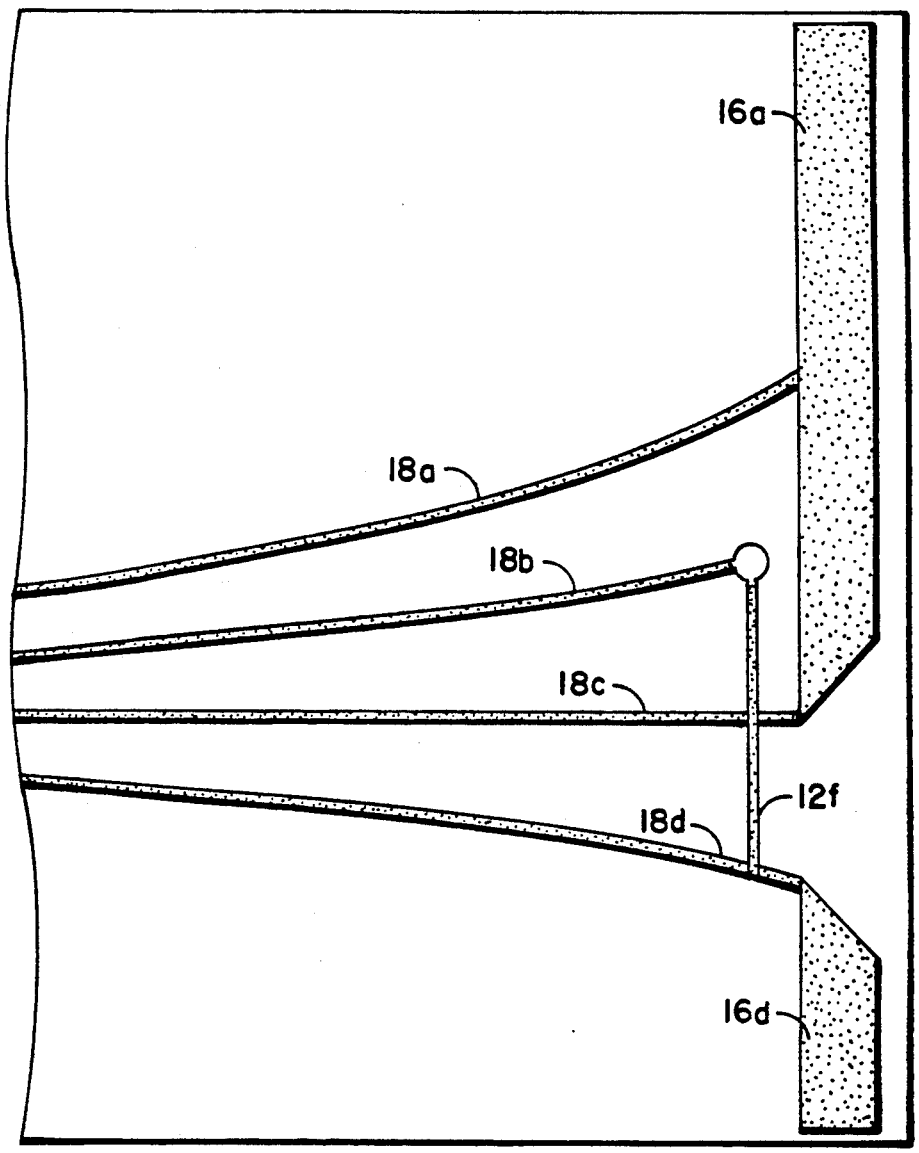
FIG. 4 is an enlarged view of a portion of FIG. 1 taken along lines 4—4 of FIG. 1.
Figure 5:
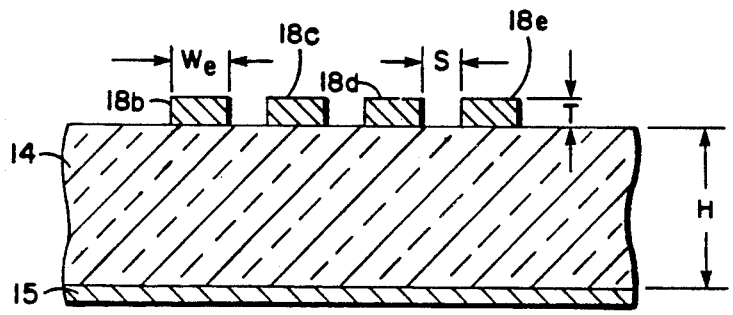
FIG. 5 is a cross-sectional view taken along line 5—5 of FIG. 1.

That is, the strip conductors, in the arrangement described above provides the conductor circuit 12 having three sections; a tightly coupled end section (FIG. 2), a center section (FIG. 3), and a loosely coupled end section (FIG. 4). The strip conductors 18a-18c have portions in the tightly coupled and center sections which are spaced relatively close to each other and have portions widely spaced from each other in the loosely coupled end section.

In operation, an ideal 3 dB hybrid combiner being a hybrid junction acts as a four-port network in which a signal incident on any one of the ports divides equally between a direct and a coupled port, without any portion arriving at the remaining isolated port. A signal entering the port coupled to branch arm 16a, will be divided equally between branch arms 16c, 16d with branch arm 16b being isolated.

The interdigitated coupler 10 of the present invention is an asymmetric hybrid circuit and accordingly is not reciprocal in operation. For example, assume branch arm 16b is terminated in a matched characteristic impedance and a signal having a unity magnitude and absolute phase angle of 0° is provided to the branch arm 16a. The signal arriving at branch arm 16b is $\{(Z_{oe}-Z_o)/(Z_{oe}+Z_o)\}e^{j(180°-2\theta)}$. The signal arriving at branch arm 16c, the coupled port, is $\{2(Z_{oe}Z_o)^{\frac{1}{2}}/(Z_{oe}+Z_o)\}e^{-j\theta}$.

On the other hand, if branch arm 16a is terminated with a matched impedance and a signal having a unity magnitude and absolute phase angle of 0° is provided to the branch arm 16b. The signal arriving at branch arm 16c, the direct port, is $(Z_{oe}-Z_o)/(Z_{oe}+Z_o)$ and at branch arm 16d, the coupled port, is $\{2(Z_{oe}Z_o)^{\frac{1}{2}}/(Z_{oe}+Z_o)\}e^{-j\theta}$.

In both arrangements, the phase difference between the direct port and coupled port, 16c, 16d, respectively is a function of the electrical length $\theta$ of the coupler.

With the interdigitated diverging-line directional coupler, coupling between the strip conductors 18a–18e occurs along the length of the strip conductors. The coupling in these situations is often referred to as being "distributed" or "continuous."

One technique known by those of ordinary skill in the art for the analysis of distributed coupled lines is the even-odd mode theory. In this analysis, the characteristics of the coupled lines are specified in terms of $Z_{oe}$ and $Z_{oo}$, their even and odd mode impedances, respectively. The even mode impedance is defined as the characteristic impedance of one line to ground when equal currents are flowing in succeeding adjacent lines. The odd mode impedance is defined as the characteristic impedance of one line to ground when equal and opposite currents are flowing in succeeding adjacent lines. In the case of the directional coupler having N transmission lines, N orthogonal modes can exist with the two modes of particular interest being the even and the odd modes.

Broadband coupled line directional couplers may also be designed using an analogy between these couplers and impedance transformers. As will be shown below, multisection directional couplers can be provided using stepped impedance transformer design techniques. However, the resulting plurality of coupling coefficients, if physically provided as stepped coupled lines, typically lead to non-theoretical interactions between the lines which degrade coupling performance, particularly above about 6 GHz. Here, to improve performance for directivity and bandwidth, smoothly tapered coupled lines are used. The differential equations of coupled transmission lines for sinusoidally time-varying electromagnetic waves can be expressed as:

$$\frac{dV}{dx} = -Z_{oe}I$$

$$\frac{dI}{dx} = \frac{-1}{Z_{oe}}V$$

where V and I are the voltage and current across the transmission lines and $Z_{oe}$ being the even mode line impedance. The general solutions for these equations can be expressed as:

$$V(x) = V_+\exp(-j\beta x) + V_-\exp(j\beta x)$$

$$I(x) = [V_+\exp(-j\beta x) - V_-\exp(j\beta x)]/Z_{oe}$$

where $\beta$ is the phase constant. The coupling coefficient, C, for a given section length, is defined as $V_-/V_+$ and can be expressed as:

$$C = \frac{j(Z_{oe}^2 - Z_o^2)\sin(\beta d)}{2Z_{oe}Z_o\cos(\beta d) + j(Z_{oe}^2 + Z_o^2)\sin(\beta d)}$$

where d is the section length of the coupler.

Under the condition that $Z_{oe}Z_{oo} = Z_o^2$ the coupling coefficient C is equal to $\rho$, the reflection coefficient of a single transmission line. A coupler design can be found by relating the impedance steps of the transformer as the even mode impedances of the coupler. This provides a method of using the theory developed for impedance transformers for the design of coupled line directional couplers. Note that when $\beta d = 90°$, the above equation for coupling coefficient C reduces to:

$$C = (Z_{oe} - Z_{oo})/(Z_{oe} + Z_{oo})$$

Here coupler directivity is better since the coupler is provided transmission lines which appear as smoothly varying impedance transformers rather than as stepped impedance transformers. The design of a transmission line having an impedance which varies uniformly as above, requires an expression that relates the input reflection coefficient of the transmission line with the characteristic impedance of the transmission line as a function of distance along the line. For an interdigitated directional coupler configuration having diverging lines the even mode impedance of the coupler can be obtained from the following equation for $\phi$ when the overall coupling coefficient K and the sidelobe of the response are defined. The even mode impedances along the tapered transmission line are expressed as:

$$Z_{oe}(x) = \exp\left\{\frac{\left[A^2\phi\left(\frac{2x}{L} - 1, A\right) + \cosh A\right]\ln Z_{oe}(L)}{2\cosh A - 1}\right\}$$

where:
A (dB) - measure of the sidelobe in dB of the Tchebycheff ripple response
$\phi$ - integral of the modified Bessel function, expressed as:

$$\phi(z, A) = \int_0^z \left(\frac{I_1[A\sqrt{(1-y^2)}]}{A(1-y^2)}\right) dy$$

Hence, to a first-order approximation, the overall coupling coefficient of the tapered coupled transmission lines becomes:

$$K = \frac{Z_{oe}(L) - Z_{oe}(0)}{Z_{oe}(L) + Z_{oe}(0)}$$

where L is the electrical pathlength of the coupler between ports 16a and 16b. This expression describes the variation of characteristic impedance with position along a divergently spaced transmission lines which is optimally designed in the "equal ripple" sense.

Synthesis of the circuit for determining the line widths and gaps, W and S respectively, along the diverging lines may be obtained using the following expressions:

$$\frac{W}{H} = (\cosh^{-1}h - \cosh^{-1}g)/\pi$$

and $$\frac{S}{H} = 2(\cosh^{-1}g)/\pi$$

where H is the thickness of the substrate, $h = (g+1)f/2 + (g-1)/2$, $f = \cosh(\pi W_e/H)/2$, $W_e$ is the even mode line width, and g is the solution of the even and odd mode line widths resulting from the even and odd mode impedances. The maximum coupling coefficient of the diverging lines along the x axis for each section is determined from the equation $$C(x) = \frac{Z_{oe}(x) - Z_{oo}(x)}{Z_{oe}(x) + Z_{oo}(x)}$$

From the above described circuit analysis and synthesis, the circuit as shown in FIGS. 1-5, was fabricated as a microwave integrated circuit (MIC) 10. In a preferred embodiment the substrate 14 having a gold-plated ground plane 15 is fabricated using alumina. For a coupler having a length of 0.75 inches, the line width dimensions of the strip conductors from the loosely coupled end to the tightly coupled end range from 2.2 mil to 1.0 mil, respectively. The line gap dimensions of the strip conductors from the loosely coupled end to the tightly coupled end varied from 29.2 mil to 0.09 mil, respectively. The coupling between transmission lines is dependent on the spacing of the strip conductors 18a-18e as well as the ground plane spacing. In addition, the extremely small spacing between the strip conductors, particularly in the tightly coupled and center sections (FIGS. 2 and 3), introduces the thickness T of the strip conductors (FIG. 5) as a further dependent characteristic contributing to the coupling between lines. In this preferred embodiment, the thickness T of the gold plating of strip conductors 18a-18e is required to be approximately 0.14 mil. The thickness T of the strip conductors may be varied using plating techniques as known by ones of ordinary skill in the art.

Figure 6:
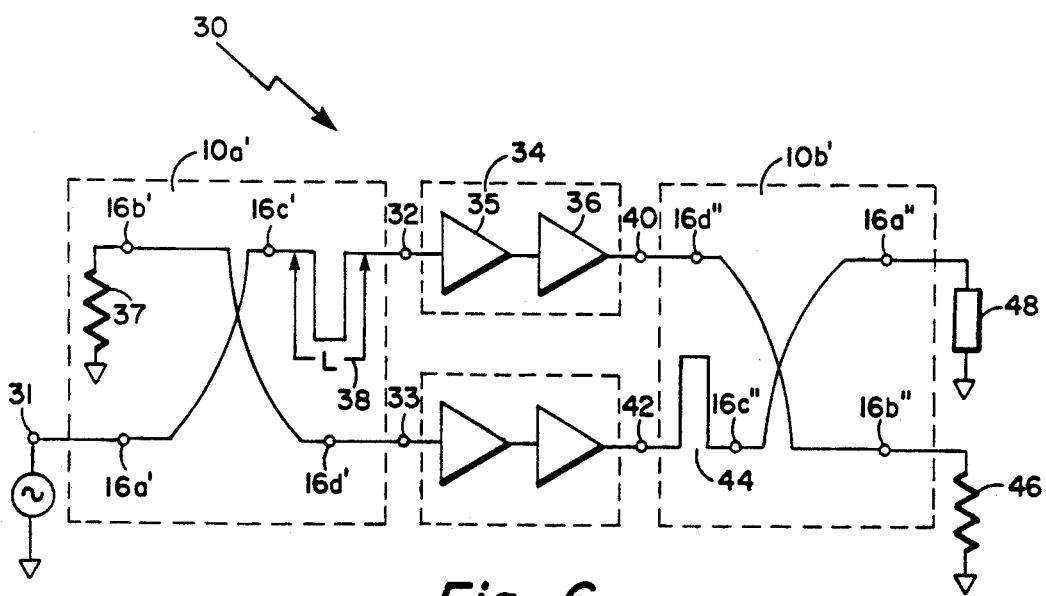
FIG. 6 is a schematic diagram of an amplifier using the interdigital power combiners of FIG. 1.

Referring now to FIG. 6, a wideband push/pull amplifier 30 having a low level of second order intermodulation products is shown to include an interdigitated tapered line hybrid circuit 10a', in accordance with the present invention, used as a power divider which is fed an input signal at terminal 31 thereof and provides at output ports 32 and 33 a pair of signals having 180° differential phase shift. Here the interdigitated tapered line hybrid circuit 10a' is comprised of a branch arm input port 16a' coupled to the input terminal 31 of the amplifier module 30 and a pair of branch arm output ports 16c', 16d'. The isolated port 16b' of hybrid circuit 10' is terminated in a characteristic impedance $Z_o$ represented by termination 37 to reduce reflections from divider 10a'. Each branch arm output port 16c', 16d' is coupled to output port 32, 33 respectively of the hybrid divider 10a', which in turn are coupled to inputs of respective ones of a pair of two stage balanced amplifiers 34. The two stage balanced amplifier circuit 34 includes a first stage amplifier 35 here, Raytheon amplifier, Part No. RPK2003, Raytheon SMDO, Northboro, Mass. and a second stage amplifier 36 here, Raytheon amplifier, Part No. RPK2004, Raytheon SMDO, Northboro, Mass. disposed in cascade.

The phase relationship between the direct and coupled ports, branch arms 16c, 16d, respectively, was discussed earlier in conjunction with the interdigitated coupler 10 in accordance with FIG. 1. As was shown, the phase difference between the branch arms 16c, 16d is a function of the electrical length $\theta$ of the coupler. The interdigitated diverging line coupler 10a' here, is shown having a transmission line having a length L coupled to direct port 16c'. The electrical pathlength L of the transmission line 38 is substantially equivalent to the electrical pathlength L between the branch arms 16a and 16b. The transmission line 38 being coupled to the direct port 16c' of the interdigitated coupler 10, provides an interdigitated diverging line asymmetric coupler 10a' having a differential phase characteristic between output ports 32 and 33, independent of the electrical length θ of the coupler. In this arrangement, assuming branch arm 16b' is terminated in a matched characteristic impedance 37, a signal fed to branch arm 16a' from amplifier input terminal 31 will divide equally between output ports 32 and 33 with a phase difference of 180°. Conversely, if branch arm 16a' were to be terminated in a matched characteristic impedance and a signal was fed to branch arm 16b', signals of substantially equal amplitude would arrive at output ports 32 and 33 with a differential phase shift of 0°, or arriving in-phase. A directional coupler having such a phase characteristic is said to be an asymmetric 180° directional coupler.

The outputs of each of the second stage amplifiers 34 are coupled to input ports 40, 42 of interdigitated tapered line hybrid circuit 10b' used here, as a power combiner. Input ports 40, 42 are in turn coupled to branch arm input ports 16d'', 16c'', respectively. Transmission line 44 is disposed between input port 42 and port 16c'' of combiner circuit 10b' to provide the required electrical phase length, needed such that were a signal fed to branch arm port 16a'' the differential phase shift between input ports 40, 42 would be 180°. Combiner 10b' has a pair of branch arm outputs 16a''', 16b'' with the first output port 16b'' terminated in a characteristic impedance 46, whereas the output port 16a'' is coupled to load 48.

In many applications using pulse modulated RF systems, Class A operation of amplifiers is used, where the RF power is switched and the DC power is applied continuously. Thus, the applied DC power is consumed during the period when the RF signal is switched off, lowering the overall efficiency of the amplifier. For this reason, Class B operation of amplifier circuits is an attractive alternative for such systems. In class B operation, the device is operated near pinch off and minimal DC power is consumed when the RF is off. Furthermore, the power efficiency only reaches its optimum value when the amplifier is operated at or near the 1 dB compression point. However, devices operated under Class B typically generate large second harmonic terms and second order intermodulation (IMD) products. These undesired signals may be present in the band of interest and can be amplified and propagated through the communication system.

The transfer function of a GaAs FET amplifier can be expressed as:

$$E_0 = K_1 E_i + K_2 E_i^2 + K_3 E_i^3$$

where $E_i$ and $E_0$ are the input and output signal amplitudes, $K_1$ is the linear gain coefficient and $K_i$'s are the ith-order non-linear coefficients. For a two-tone input signal, $E_i = A(\cos\omega_1 t + \cos\omega_2 t)$, the output amplitude of the signal becomes:

$$E_0 = DC + \text{1st-order terms} + \text{2nd-order terms} + \text{3rd-order terms}$$

where $$\text{2nd-order terms} = K_2 A^2 [\text{2nd-order IMD Products}] + (\tfrac{1}{2}) K_2 A^2 [\text{2nd-order harmonics}]$$

$$\text{2nd-order IMD products} = \cos(\omega_1 + \omega_2)t + \cos(\omega_1 - \omega_2)t$$

$$\text{2nd-order harmonics} = \cos(2\omega_1 t) + \cos(2\omega_2 t)$$

This mathematical expression shows that both the second harmonic terms and the second-order IMD products are related to the second-order non-linear coefficient, $K_2$. In some applications the second-order IMD product may be as much as 6 dB higher than the second harmonics.

To show that the second-order terms can be canceled by an amplifier module using interdigitated tapered line couplers as shown in FIG. 6, let the input signal be $$E_1 = A \cos(\omega t)$$

at input terminal 31 of the wideband push/pull amplifier 30. At terminals 32 and 33 of the divider 10' the signals become $$E_2 = A/\sqrt{2} \, \cos[\omega t + kd]$$

$$E_3 = A/\sqrt{2} \, \cos[\omega t + kd - 180°]$$

where k is the propagation constant, and d is the electrical length of the interdigitated Lange coupler.

The signals fed to ports 32 and 33 of the amplifier modules 34 have a differential phase shift of 180° at the fundamental frequency. These signals experience another 180° phase difference through output combiner 10b' and arrive at port 16a'' in phase. However, since the FET is the source of non-linearity, the second-harmonics, second order intermodulation products as well as other even order harmonics and intermodulation products arrive at port 16a'' out-of-phase by 180° and are substantially canceled.

Figure 7:
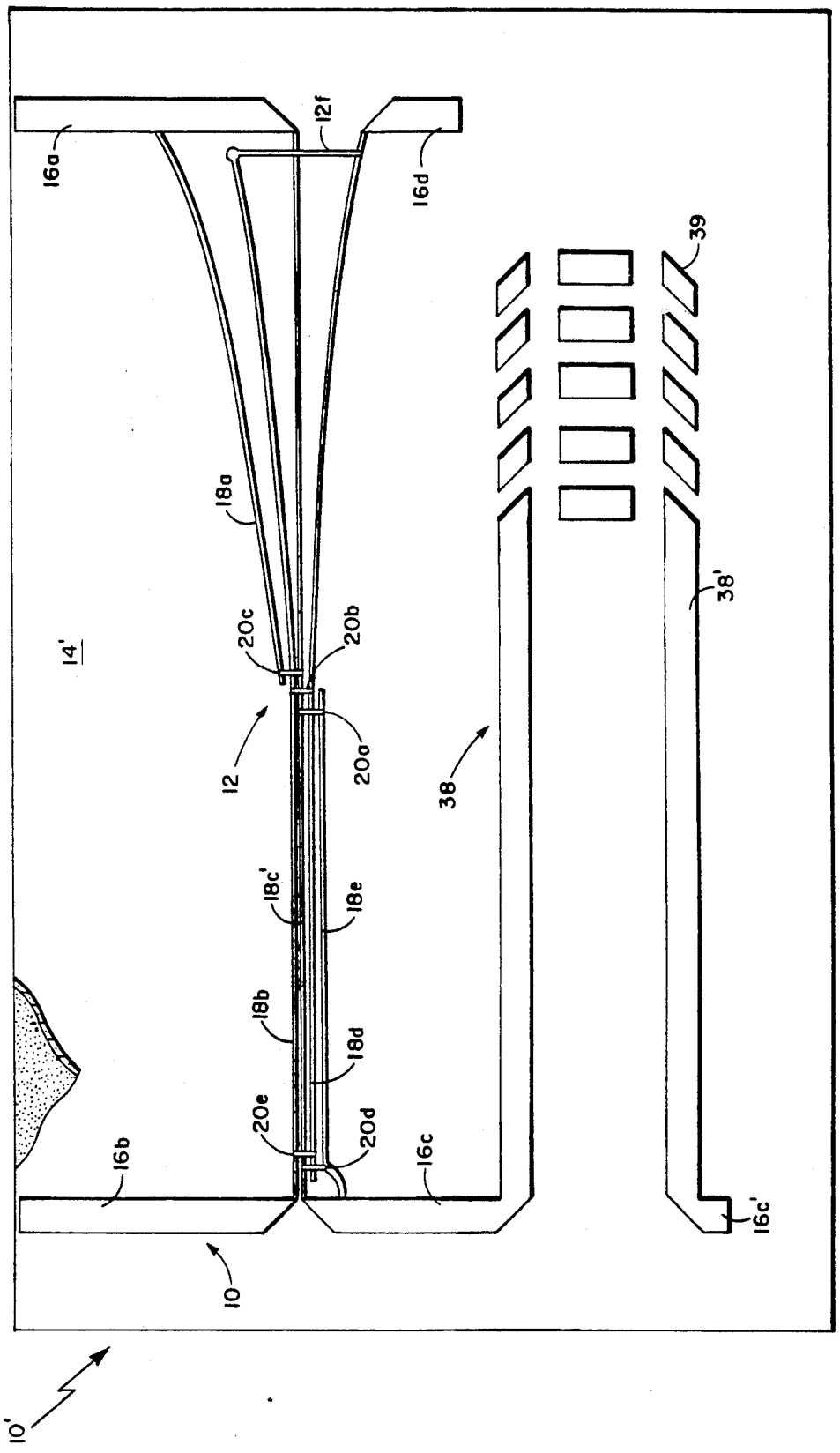
FIG. 7 is a plan view of an interdigital 180° hybrid combiner fabricated as a microwave integrated circuit in accordance with the present invention.

Referring now to FIG. 7, the interdigitated diverging line 180° hybrid combiner 10a' of FIG. 6, is shown fabricated as a microwave integrated circuit (MIC) 10'. In this configuration, the 180° combiner 10' includes the interdigitated diverging line hybrid combiner 10 (FIG. 1), as described above, having an output direct port 16c coupled to the input of a transmission line circuit 38. The transmission line circuit 38 has a strip conductor 38' which together with the dielectric substrate 14 and an underlying ground plane conductor (not shown) provides the transmission line 38 having an electrical pathlength such that in response to a signal fed to branch arm 16a, with branch arm 16b terminated, signals arriving at branch arm 16d and at output port 16c' having a differential phase shift therebetween of substantially 180°. Preferably, spaced pads 39 are disposed adjacent the bent end of strip conductor 38' and a selective combination of the pads are interconnected to provide the strip conductor 38' with a physical length such that the desired electrical pathlength for transmission line 38 and hence the differential phase shift between the coupled and direct ports is obtained. Here, for a coupler as generally described in conjunction with FIGS. 1-5, the transmission line 38 has a physical length of 0.75 inches. Conversely, in response to a signal fed to branch arm 16b and with branch arm 16a terminated, signals arriving at branch arm 16d and at output port 16c', have a differential phase shift therebetween of 0°.

Having described the preferred embodiments of the invention, it will now become apparent to one of skill in the art that other embodiments incorporating their concepts may be used. It is felt, therefore, that these embodiments should not be limited to disclosed embodiments but rather should be limited only in the spirit and scope of the appended claims.

What is claimed is:

1. A radio frequency coupler comprising:
a dielectric substrate having a ground plane disposed over a first surface thereof; and
a plurality of strip conductors disposed over a second surface of said dielectric substrate, a first one of said plurality of strip conductors having a first end coupled to a first terminal and a second end coupled to a second terminal of the radio frequency coupler, and a second one of the plurality of strip conductors, disposed adjacent to said first strip conductor, having a first end coupled to a third terminal of the radio frequency coupler, said second strip conductor having a first portion spaced a substantially uniform distance from said first strip conductor with said first portion being coupled to said third terminal and a second portion spaced from said first strip conductor a distance which gradually increases, a third one of the plurality of strip conductors, disposed adjacent to said first strip conductor on a side thereof opposite the second strip conductor, having a first end coupled to a fourth terminal of the coupler, with said third conductor having a first portion at said end thereof spaced a distance from said first strip conductor which gradually decreases to a second portion spaced a substantially uniform distance from said first strip conductor; and
said second strip conductor being coupled to said third strip conductor by a conductor disposed over and dielectrically spaced from said first strip conductor.

2. The radio frequency coupler as recited in claim 1, further comprising a fourth strip conductor disposed adjacent to said second strip conductor, having a first end coupled to said second terminal of the coupler, said fourth strip conductor having a first portion spaced a distance from said first strip conductor which gradually decreases.

3. The radio frequency coupler as recited in claim 2, further comprising a fifth strip conductor, disposed adjacent to said third strip conductor, having a first end coupled to said first terminal of the coupler, said fifth strip conductor spaced a substantially uniform distance from said third strip conductor.

4. The radio frequency coupler as recited in claim 1, further comprising a transmission line having a first end coupled to said first terminal of said radio frequency coupler having a selected electrical pathlength.

5. A radio frequency coupler comprising:
a dielectric substrate having a ground plane disposed over a first surface thereof; and
a plurality of strip conductors disposed over a second surface of said dielectric substrate, a first one of said plurality of strip conductors having a first end coupled to a first terminal and a second end coupled to a second terminal of the radio frequency coupler, and a second one of the plurality of strip conductors, disposed adjacent to said first strip conductor, having a first end coupled to a third terminal of the radio frequency coupler, said second strip conductor having a first portion spaced a substantially uniform distance from said first strip conductor with said first portion being coupled to said third terminal and a second portion spaced from said first strip conductor a distance which gradually increases, a third one of the plurality of strip conductors, disposed adjacent to said first strip conductor on a side thereof opposite the second strip conductor, having a first end coupled to a fourth terminal of the coupler, with said third conductor having a first portion at said end thereof spaced a distance from said first strip conductor which gradually decreases to a second portion spaced a substantially uniform distance from said first strip conductor wherein alternate strip conductors are coupled by a conductor disposed over and dielectrically spaced from a strip conductor disposed between said adjacent strip conductors.

6. A radio frequency coupler comprising:
a dielectric substrate having a ground plane disposed over a first surface thereof; and
a plurality of strip conductors disposed over a second surface of said dielectric substrate, a first one of said plurality of strip conductors having a first end coupled to a first terminal and a second end coupled to a second terminal of the radio frequency coupler, and a second one of the plurality of strip conductors, disposed adjacent to said first strip conductor, having a first end coupled to a third terminal of the radio frequency coupler, said second strip conductor having a first portion spaced a substantially uniform distance from said first strip conductor with said first portion being coupled to said third terminal and a second portion spaced from said first strip conductor a distance which gradually increases, a third one of the plurality of strip conductors, disposed adjacent to said first strip conductor on a side thereof opposite the second strip conductor, having a first end coupled to a fourth terminal of the coupler, with said third conductor having a first portion at said end thereof spaced a distance from said first strip conductor which gradually decreases to a second portion spaced a substantially uniform distance from said first strip conductor; and
a transmission line having a first end coupled to said first terminal of said radio frequency coupler having a selected electrical pathlength wherein in response to a signal fed to said second terminal, a first one of a pair of signals is provided to a second end of said transmission line and a second of said pair is provided to said fourth terminal of said coupler having a differential phase shift therebetween of substantially 180°.

7. The radio frequency coupler as recited in claim 6 wherein in response to a signal fed to said third terminal, a first one of a pair of signals is provided to said second end of said transmission line and a second one of said pair of signals is provided to said fourth terminal of said radio frequency coupler with a differential phase shift therebetween of 0°.

8. A radio frequency coupler comprising:
a dielectric substrate having a ground plane disposed over a first surface thereof; and
a plurality of strip conductors disposed over a second surface of said dielectric substrate, a first one of said plurality of strip conductors having a first end coupled to a first terminal and a second end coupled to a second terminal of the radio frequency coupler, and a second one of the plurality of strip conductors, disposed adjacent to said first strip conductor, having a first end coupled to a third terminal of the radio frequency coupler, said second strip conductor having a first portion spaced a substantially uniform distance from said first strip conductor with said first portion being coupled to said third terminal and a second portion spaced from said first strip conductor a distance which gradually increases, a third one of the plurality of strip conductors, disposed adjacent to said first strip conductor on a side thereof opposite the second strip conductor, having a first end coupled to a fourth terminal of the coupler, with said third conductor having a first portion at said end thereof spaced a distance from said first strip conductor which gradually decreases to a second portion spaced a substantially uniform distance from said first strip conductor;

a transmission line having a first end coupled to said first terminal of said radio frequency coupler having a selected electrical pathlength wherein in response to a signal fed to said second terminal, a first one of a pair of signals is provided to a second end of said transmission line and a second of said pair is provided to said fourth terminal of said coupler having a differential phase shift therebetween of substantially 180° and wherein said coupler, in response to a signal having second order harmonic frequency components, fed to said second terminal provides a first one of a pair of signals to said second end of said transmission line and a second one of said pair of said signals to said fourth terminal, each of said pair of signals having said second order harmonic frequency components substantially canceled.

9. A radio frequency coupler comprising:
a dielectric substrate having a ground plane disposed over a first surface thereof;
a plurality of strip conductors disposed over a second surface of said dielectric substrate, a first one of said plurality of strip conductors having a first end coupled to a first terminal and a second end coupled to a second terminal of the radio frequency coupler, and a second one of the plurality of strip conductors, disposed adjacent to said first strip conductor, having a first end coupled to a third terminal of the radio frequency coupler, said second strip conductor having a first portion spaced a substantially uniform distance from said first strip conductor with said first portion being coupled to said third terminal and a second portion spaced from said first strip conductor a distance which gradually increases, a third one of the plurality of strip conductors, disposed adjacent to said first strip conductor on a side thereof opposite the second strip conductor, having a first end coupled to a fourth terminal of the coupler, with said third conductor having a first portion at said end thereof spaced a distance from said first strip conductor which gradually decreases to a second portion spaced a substantially uniform distance from said first strip conductor;

a transmission line having a first end coupled to said first terminal of said radio frequency coupler having a selected electrical pathlength wherein in response to a signal fed to said second terminal, a first one of a pair of signals is provided to a second end of said transmission line and a second of said pair is provided to said fourth terminal of said coupler having a differential phase shift therebetween of substantially 180°; and wherein said coupler in response to a pair of input signals, having substantially a 0° phase shift therebetween, with a first one of said pair of input signals fed to said second end of said transmission line and a second one of said pair of input signals fed to said fourth terminal, each of said pair of input signals having a corresponding power level, provides an output signal at said third terminal having a power level which is substantially the sum of the power levels of said pair of input signals.

10. A radio frequency coupler comprising:
a dielectric substrate having a ground plane disposed over a first surface thereof;
a plurality of strip conductors disposed over a second surface of said dielectric substrate, a first one of said plurality of strip conductors having a first end coupled to a first terminal and a second end coupled to a second terminal of the radio frequency coupler, and a second one of the plurality of strip conductors, disposed adjacent to said first strip conductor, having a first end coupled to a third terminal of the radio frequency coupler, said second strip conductor having a first portion spaced a substantially uniform distance from said first strip conductor with said first portion being coupled to said third terminal and a second portion spaced from said first strip conductor a distance which gradually increases, a third one of the plurality of strip conductors, disposed adjacent to said first strip conductor on a side thereof opposite the second strip conductor, having a first end coupled to a fourth terminal of the coupler, with said third conductor having a first portion at said end thereof spaced a distance from said first strip conductor which gradually decreases to a second portion spaced a substantially uniform distance from said first strip conductor;

a transmission line having a first end coupled to said first terminal of said radio frequency coupler having a selected electrical pathlength wherein in response to a signal fed to said second terminal, a first one of a pair of signals is provided to a second end of said transmission line and a second of said pair is provided to said fourth terminal of said coupler having a differential phase shift therebetween of substantially 180°; and wherein said coupler in response to a pair of input signals, having substantially a 180° differential phase shift therebetween, with a first one of said pair of input signals fed to said second end of said transmission line and a second one of said pair of input signals fed to said fourth terminal, each of said pair of input signals having a corresponding power level provides an output signal at said second terminal having a power level which is substantially the sum of the power levels of said pair of input signals.

11. A radio frequency amplifier comprising:
a pair of radio frequency couplers, each comprising:
(a) a dielectric substrate having a ground plane disposed over a first surface thereof; and
(b) a plurality of strip conductors disposed on a second surface of said dielectric substrate, a first one of said plurality of strip conductors having a first end coupled to a first terminal and a second end coupled to a second terminal of the radio frequency coupler, and a second one of the plurality of strip conductors, disposed adjacent to said first strip conductor, having a first end coupled to a third terminal of the radio frequency coupler, said second strip conductor having a first portion spaced a substantially uniform distance from said first strip conductor with said first portion being coupled to said third terminal and a second portion spaced from said first strip conductor a distance which gradually increases; a third one of the plurality of strip conductors, disposed adjacent to said first strip conductor on a side thereof opposite the second strip conductor, having a first end coupled to a fourth terminal of the coupler, with said third conductor having a first portion at said end thereof spaced a distance from said first strip conductor which gradually decreases to a second portion spaced a substantially uniform distance from said first strip conductor; and (c) a transmission line having a first end coupled to said first terminal of said radio frequency coupler;

first amplifier means, having an input coupled to a second end of said transmission line of a first one of said pair of radio frequency couplers and an output coupled to said third terminal of a second one of said pair of radio frequency couplers, for amplifying a first signal passing therethrough; and second amplifier means, having an input coupled to said third terminal of said first one of said pair of radio frequency couplers and an output coupled to a second end of said transmission line of a second one of said pair of radio frequency couplers, for amplifying a second signal passing therethrough.

12. The radio frequency amplifier, as recited in claim 11 wherein said radio amplifier in response to a signal having frequency components corresponding to a fundamental frequency component, fed to said second terminal of said first one of said pair of radio frequency couplers, said first and second amplifier means to provide signals corresponding to said fundamental frequency component, a second harmonic component, and second order intermodulation product components to said third terminal and said second end of said transmission line of said second one of said pair of radio frequency signals, such that an output signal arriving at said second terminal of said second one of said pair of radio frequency couplers has said fundamental frequency component and said second harmonic component and second order intermodulation product components are substantially suppressed.

* * * * *